United States Patent
Singh

(10) Patent No.: US 8,605,208 B2
(45) Date of Patent: Dec. 10, 2013

(54) SMALL FORM FACTOR MODULES USING WAFER LEVEL OPTICS WITH BOTTOM CAVITY AND FLIP-CHIP ASSEMBLY

(75) Inventor: Harpuneet Singh, Dublin, CA (US)

(73) Assignee: DigitalOptics Corporation, San Jose, CA (US)

( * ) Notice: Subject to any disclaimer, the term of this patent is extended or adjusted under 35 U.S.C. 154(b) by 796 days.

(21) Appl. No.: 12/150,118

(22) Filed: Apr. 24, 2008

(65) Prior Publication Data

US 2010/0053423 A1 Mar. 4, 2010

Related U.S. Application Data

(60) Provisional application No. 60/925,946, filed on Apr. 24, 2007.

(51) Int. Cl.
*H04N 5/225* (2006.01)

(52) U.S. Cl.
USPC .......................... 348/374; 348/373; 348/340

(58) Field of Classification Search
USPC .......................... 348/340, 373–374; 438/118
See application file for complete search history.

(56) References Cited

U.S. PATENT DOCUMENTS

| | | | |
|---|---|---|---|
| 2,279,372 A | 4/1942 | Herzberger |
| 3,087,384 A | 4/1963 | Baur et al. |
| 3,393,622 A | 7/1968 | Schöttle et al. |
| 3,599,377 A | 8/1971 | Dartnell |
| 3,609,270 A | 9/1971 | Jorgensen et al. |
| 3,696,725 A | 10/1972 | Lange |
| 4,229,092 A | 10/1980 | Iwata |
| 4,257,086 A | 3/1981 | Gulliksen |

(Continued)

FOREIGN PATENT DOCUMENTS

| | | |
|---|---|---|
| CN | 1324012 A | 11/2001 |
| CN | 1517735 A | 8/2004 |

(Continued)

OTHER PUBLICATIONS

Shin et al.; *Fabrication of Phone-Camera Module Using Wafer-Scale UV Embossing Process*; Sensors, Cameras, and Systems for Scientific/Industrial Applications VII, edited by Morley M. Burke; Proc. Of SPIE—IS&T Electronic Imaging; SPIE vol. 6068, 60680Q, © 2006 SPIE—IS&T.

(Continued)

*Primary Examiner* — James Hannett
*Assistant Examiner* — Yih-Sien Kao
(74) *Attorney, Agent, or Firm* — Larry E. Henneman, Jr.; Gregory P. Gibson; Henneman & Associates, PLC

(57) ABSTRACT

A disclosed method of manufacturing a camera module includes providing a stack of optical elements, providing an integrated circuit image capture device (ICD) having a top surface with an array of sensors, rigidly attaching the stack of optical elements to top surface of the image capture device, providing a substrate having an opening therethrough and a recess around said opening, and attaching the image capture device to the substrate such that edges of the image capture device are disposed in the recess and the stack of optical elements extends through the opening. The method further includes providing a second substrate (e.g., host PCB) and mounting the substrate on the second substrate to attach the camera module to the host device. Optionally, the substrate is mounted to the second substrate via a reflow solder process.

21 Claims, 8 Drawing Sheets

(56) References Cited

U.S. PATENT DOCUMENTS

| | | | |
|---|---|---|---|
| 4,290,168 A | 9/1981 | Binge | |
| 4,345,021 A | 8/1982 | Ogawa et al. | |
| 4,457,619 A | 7/1984 | Takahashi et al. | |
| 4,681,416 A | 7/1987 | Raschke | |
| 4,687,314 A | 8/1987 | Raschke | |
| 4,690,512 A | 9/1987 | Forsyth | |
| 4,727,389 A | 2/1988 | Raschke | |
| 4,879,592 A | 11/1989 | Ernest | |
| 4,987,435 A | 1/1991 | Touma et al. | |
| 5,016,993 A | 5/1991 | Akitake | |
| 5,034,824 A | 7/1991 | Morisawa et al. | |
| 5,054,886 A | 10/1991 | Ozaki et al. | |
| 5,095,204 A | 3/1992 | Novini | |
| 5,119,121 A | 6/1992 | Kobayashi et al. | |
| 5,149,181 A | 9/1992 | Bedford | |
| 5,177,638 A | 1/1993 | Emura et al. | |
| 5,196,963 A | 3/1993 | Sato et al. | |
| 5,218,484 A | 6/1993 | Terai | |
| 5,272,567 A | 12/1993 | Inoue | |
| 5,510,937 A | 4/1996 | Mogamiya | |
| 5,529,936 A | 6/1996 | Rostoker | |
| 5,546,147 A | 8/1996 | Baxter et al. | |
| 5,689,746 A | 11/1997 | Akada et al. | |
| 5,754,210 A | 5/1998 | Haneda et al. | |
| 5,805,362 A | 9/1998 | Hayes | |
| 5,825,559 A | 10/1998 | Johnson et al. | |
| 5,831,777 A | 11/1998 | Iwasa | |
| 5,835,208 A | 11/1998 | Hollmann et al. | |
| 5,866,942 A | 2/1999 | Suzuki et al. | |
| 5,908,586 A | 6/1999 | Hobbs et al. | |
| 5,912,872 A | 6/1999 | Feldman et al. | |
| 5,926,965 A | 7/1999 | Shijo et al. | |
| 5,954,192 A | 9/1999 | Iitsuka | |
| 5,966,248 A | 10/1999 | Kurokawa et al. | |
| 6,011,661 A | 1/2000 | Weng | |
| 6,091,902 A | 7/2000 | Komatsuzaki et al. | |
| 6,096,155 A | 8/2000 | Harden et al. | |
| 6,235,141 B1 | 5/2001 | Feldman et al. | |
| 6,249,311 B1 | 6/2001 | Rouse et al. | |
| 6,255,640 B1 | 7/2001 | Endo et al. | |
| 6,256,155 B1 | 7/2001 | Nagaoka | |
| 6,282,380 B1 | 8/2001 | Yamamoto | |
| 6,285,064 B1 | 9/2001 | Foster | |
| 6,292,306 B1 | 9/2001 | Betensky | |
| 6,295,156 B1 | 9/2001 | Feldman et al. | |
| 6,324,010 B1 | 11/2001 | Bowen et al. | |
| 6,330,400 B1 | 12/2001 | Bittner et al. | |
| 6,351,288 B1 | 2/2002 | Johnson et al. | |
| 6,359,740 B1 | 3/2002 | Tsuchiya | |
| 6,374,004 B1 | 4/2002 | Han et al. | |
| 6,381,072 B1 | 4/2002 | Burger | |
| 6,406,583 B1 | 6/2002 | Harden et al. | |
| 6,417,601 B1 | 7/2002 | Kim | |
| 6,426,829 B1 | 7/2002 | Feldman et al. | |
| 6,426,839 B2 | 7/2002 | Dou et al. | |
| 6,451,150 B2 | 9/2002 | Feldman et al. | |
| 6,476,417 B2 | 11/2002 | Honda et al. | |
| 6,476,985 B2 | 11/2002 | Dou et al. | |
| 6,483,627 B2 | 11/2002 | Feldman et al. | |
| 6,530,703 B2 | 3/2003 | Nakano et al. | |
| 6,555,812 B1 | 4/2003 | Bohn | |
| 6,566,745 B1 | 5/2003 | Beyne et al. | |
| 6,582,079 B2 | 6/2003 | Levine | |
| 6,590,720 B2 | 7/2003 | Oba | |
| 6,597,516 B2 | 7/2003 | Saitoh et al. | |
| 6,649,008 B2 | 11/2003 | Feldman et al. | |
| 6,654,187 B2 | 11/2003 | Ning | |
| 6,669,803 B1 | 12/2003 | Kathman et al. | |
| 6,670,205 B1 | 12/2003 | Byun | |
| 6,681,162 B2 | 1/2004 | Yun | |
| 6,683,298 B1 | 1/2004 | Chang et al. | |
| 6,760,167 B2 | 7/2004 | Meehan et al. | |
| 6,762,888 B1 | 7/2004 | Oshima | |
| 6,771,439 B2 | 8/2004 | Ting | |
| 6,777,311 B2 | 8/2004 | Han et al. | |
| 6,792,246 B2 | 9/2004 | Takeda et al. | |
| 6,805,499 B2 | 10/2004 | Westerweck et al. | |
| 6,836,382 B2 | 12/2004 | Ning | |
| 6,841,883 B1 | 1/2005 | Farnworth et al. | |
| 6,853,005 B2 | 2/2005 | Ikeda | |
| 6,869,233 B2 | 3/2005 | Westerweck et al. | |
| 6,873,024 B1 | 3/2005 | Prabhu et al. | |
| 6,885,107 B2 | 4/2005 | Kinsman | |
| 6,940,209 B2 | 9/2005 | Henderson | |
| 6,995,462 B2 | 2/2006 | Bolken et al. | |
| 7,010,224 B2 | 3/2006 | Nomura | |
| 7,019,374 B2 | 3/2006 | Kayanuma et al. | |
| 7,043,284 B2 | 5/2006 | Tornaghi | |
| 7,046,296 B2 * | 5/2006 | Shinomiya | 348/374 |
| 7,078,799 B2 | 7/2006 | Vittu | |
| 7,088,525 B2 | 8/2006 | Finizio et al. | |
| 7,127,162 B2 | 10/2006 | Mano | |
| 7,129,146 B2 | 10/2006 | Hsu | |
| 7,142,368 B2 | 11/2006 | Kim et al. | |
| 7,156,564 B2 | 1/2007 | Watanabe et al. | |
| 7,167,376 B2 | 1/2007 | Miyashita et al. | |
| 7,169,645 B2 | 1/2007 | Bolken et al. | |
| 7,190,404 B2 | 3/2007 | Shinomiya | |
| 7,193,793 B2 | 3/2007 | Murakami et al. | |
| 7,199,438 B2 | 4/2007 | Appelt et al. | |
| 7,205,095 B1 | 4/2007 | Prabhu et al. | |
| 7,242,433 B2 | 7/2007 | Tanaka et al. | |
| 7,245,319 B1 | 7/2007 | Enomoto | |
| 7,259,497 B2 | 8/2007 | Sakano et al. | |
| 7,280,149 B2 | 10/2007 | Weintroub et al. | |
| 7,301,577 B2 | 11/2007 | Sakamoto | |
| 7,301,712 B2 | 11/2007 | Kamo | |
| 7,330,648 B2 | 2/2008 | Morinaga et al. | |
| 7,378,724 B2 | 5/2008 | Yu et al. | |
| 7,379,112 B1 | 5/2008 | Raad | |
| 7,388,613 B2 | 6/2008 | Raschke | |
| 7,394,602 B2 | 7/2008 | Chen et al. | |
| 7,400,454 B2 | 7/2008 | Kubota et al. | |
| 7,414,661 B2 * | 8/2008 | Hartlove et al. | 348/340 |
| 7,420,609 B2 | 9/2008 | Yamaguchi et al. | |
| 7,422,382 B2 | 9/2008 | Seo | |
| 7,433,555 B2 | 10/2008 | Lee et al. | |
| 7,442,382 B2 | 10/2008 | Henson et al. | |
| 7,444,073 B2 | 10/2008 | Lee | |
| 7,457,050 B2 | 11/2008 | Betensky | |
| 7,469,100 B2 | 12/2008 | Toor et al. | |
| 7,477,461 B2 | 1/2009 | Bareau et al. | |
| 7,531,773 B2 | 5/2009 | Westerweck et al. | |
| 7,564,111 B2 | 7/2009 | Sawahata et al. | |
| 7,579,583 B2 | 8/2009 | Mok et al. | |
| 7,593,057 B2 | 9/2009 | Yee et al. | |
| 7,605,991 B2 | 10/2009 | Chiang | |
| 7,638,813 B2 | 12/2009 | Kinsman | |
| 7,670,067 B2 | 3/2010 | Utz | |
| 7,675,565 B2 | 3/2010 | Cheng | |
| 7,679,669 B2 | 3/2010 | Kwak | |
| 7,684,689 B2 | 3/2010 | Shangguan et al. | |
| 7,773,876 B2 | 8/2010 | Westerweck et al. | |
| 7,796,187 B2 * | 9/2010 | Shangguan et al. | 348/374 |
| 7,806,606 B2 | 10/2010 | Westerweck | |
| 7,825,985 B2 | 11/2010 | Westerweck et al. | |
| 7,864,245 B2 | 1/2011 | Yoon et al. | |
| 7,873,269 B2 | 1/2011 | Toor et al. | |
| 7,901,973 B2 | 3/2011 | Yamamoto | |
| 7,939,901 B2 | 5/2011 | Minamio et al. | |
| 7,983,556 B2 | 7/2011 | Westerweck et al. | |
| 8,112,128 B2 | 2/2012 | Lee | |
| 8,149,321 B2 | 4/2012 | Ryu et al. | |
| 8,204,372 B2 | 6/2012 | Toor et al. | |
| 8,248,523 B2 | 8/2012 | Chua et al. | |
| 2001/0028513 A1 | 10/2001 | Takanashi et al. | |
| 2002/0012066 A1 | 1/2002 | Nagai | |
| 2002/0018140 A1 | 2/2002 | Suemoto et al. | |
| 2002/0094198 A1 | 7/2002 | Uchiyama | |
| 2002/0102946 A1 | 8/2002 | SanGiovanni | |
| 2002/0136556 A1 | 9/2002 | Nomura et al. | |
| 2002/0142798 A1 | 10/2002 | Miyake | |
| 2002/0144369 A1 | 10/2002 | Biggs et al. | |
| 2003/0012573 A1 | 1/2003 | Sekizawa et al. | |

(56) References Cited

U.S. PATENT DOCUMENTS

| | | |
|---|---|---|
| 2003/0016452 A1* | 1/2003 | Sayag .................. 359/664 |
| 2003/0043477 A1 | 3/2003 | Saitoh |
| 2003/0137595 A1 | 7/2003 | Takachi |
| 2003/0137747 A1 | 7/2003 | Ting |
| 2003/0174419 A1 | 9/2003 | Kindler et al. |
| 2003/0218251 A1 | 11/2003 | Seo |
| 2004/0017501 A1 | 1/2004 | Asaga et al. |
| 2004/0042779 A1 | 3/2004 | Maeda et al. |
| 2004/0042780 A1 | 3/2004 | Kindaichi et al. |
| 2004/0042785 A1 | 3/2004 | Watanabe et al. |
| 2004/0042786 A1 | 3/2004 | Watanabe et al. |
| 2004/0056970 A1 | 3/2004 | Westerweck et al. |
| 2004/0056974 A1 | 3/2004 | Kitajima et al. |
| 2004/0057720 A1 | 3/2004 | Westerweck et al. |
| 2004/0077121 A1 | 4/2004 | Maeda et al. |
| 2004/0089859 A1 | 5/2004 | Shirakawa et al. |
| 2004/0095657 A1 | 5/2004 | Takanashi et al. |
| 2004/0125225 A1 | 7/2004 | Noguchi |
| 2004/0150891 A1 | 8/2004 | Ichino |
| 2004/0165877 A1 | 8/2004 | Hsiao |
| 2004/0189862 A1 | 9/2004 | Gustavsson et al. |
| 2004/0201773 A1 | 10/2004 | Ostergard |
| 2004/0203532 A1 | 10/2004 | Mizuta |
| 2004/0212719 A1* | 10/2004 | Ikeda .................. 348/340 |
| 2004/0223068 A1 | 11/2004 | Kamo |
| 2004/0223072 A1 | 11/2004 | Maeda et al. |
| 2004/0245649 A1 | 12/2004 | Imaoka |
| 2004/0258405 A1 | 12/2004 | Shiratori et al. |
| 2004/0263999 A1 | 12/2004 | Chan et al. |
| 2005/0014538 A1 | 1/2005 | Hyun et al. |
| 2005/0040510 A1 | 2/2005 | Hashimoto |
| 2005/0063695 A1 | 3/2005 | Kameyama |
| 2005/0063698 A1 | 3/2005 | Usuda et al. |
| 2005/0073602 A1 | 4/2005 | Kamoda et al. |
| 2005/0077458 A1 | 4/2005 | Ma et al. |
| 2005/0110107 A1 | 5/2005 | Yamamoto et al. |
| 2005/0129384 A1 | 6/2005 | Nishida et al. |
| 2005/0157195 A1 | 7/2005 | Ohashi et al. |
| 2005/0162534 A1 | 7/2005 | Higashiyama et al. |
| 2005/0179805 A1 | 8/2005 | Avron et al. |
| 2005/0185088 A1 | 8/2005 | Kale et al. |
| 2005/0190283 A1 | 9/2005 | Ish-Shalom et al. |
| 2005/0219398 A1 | 10/2005 | Sato et al. |
| 2005/0219399 A1 | 10/2005 | Sato et al. |
| 2005/0237418 A1 | 10/2005 | Sakamoto |
| 2005/0248684 A1 | 11/2005 | Machida |
| 2005/0264670 A1 | 12/2005 | Yamaguchi et al. |
| 2005/0285016 A1 | 12/2005 | Kong et al. |
| 2005/0285973 A1 | 12/2005 | Singh et al. |
| 2005/0286352 A1 | 12/2005 | Inui |
| 2006/0006511 A1 | 1/2006 | Roh et al. |
| 2006/0019428 A1 | 1/2006 | Kurosawa et al. |
| 2006/0028573 A1 | 2/2006 | Seo et al. |
| 2006/0043513 A1 | 3/2006 | Kim |
| 2006/0044450 A1 | 3/2006 | Wolterink et al. |
| 2006/0049720 A1 | 3/2006 | Henderson et al. |
| 2006/0054787 A1 | 3/2006 | Olsen et al. |
| 2006/0056389 A1 | 3/2006 | Monk et al. |
| 2006/0066945 A1 | 3/2006 | Yeo et al. |
| 2006/0066959 A1 | 3/2006 | Koga et al. |
| 2006/0083503 A1 | 4/2006 | Fukai |
| 2006/0087017 A1 | 4/2006 | Chao et al. |
| 2006/0087018 A1 | 4/2006 | Chao et al. |
| 2006/0098969 A1 | 5/2006 | Asai et al. |
| 2006/0103754 A1 | 5/2006 | Wenstrand et al. |
| 2006/0103953 A1 | 5/2006 | Lee et al. |
| 2006/0109367 A1 | 5/2006 | Hirooka |
| 2006/0113867 A1 | 6/2006 | Sakatani et al. |
| 2006/0124746 A1 | 6/2006 | Kim et al. |
| 2006/0127085 A1 | 6/2006 | Matsuki et al. |
| 2006/0132644 A1 | 6/2006 | Shangguan et al. |
| 2006/0139776 A1 | 6/2006 | Mori et al. |
| 2006/0170811 A1 | 8/2006 | Joung |
| 2006/0181748 A1 | 8/2006 | Makii et al. |
| 2006/0192885 A1 | 8/2006 | Calvet et al. |
| 2006/0193064 A1 | 8/2006 | Kim |
| 2006/0209205 A1 | 9/2006 | Tsai |
| 2006/0215053 A1 | 9/2006 | Kinoshita |
| 2006/0216014 A1 | 9/2006 | Morinaga et al. |
| 2006/0223216 A1 | 10/2006 | Chang et al. |
| 2006/0243884 A1 | 11/2006 | Onodera et al. |
| 2006/0249737 A1 | 11/2006 | Fujimori |
| 2006/0251414 A1* | 11/2006 | Nishizawa .................. 396/275 |
| 2006/0257131 A1 | 11/2006 | Yoon et al. |
| 2006/0261257 A1 | 11/2006 | Hwang |
| 2006/0291061 A1 | 12/2006 | Iyama et al. |
| 2007/0008631 A1 | 1/2007 | Webster et al. |
| 2007/0009246 A1 | 1/2007 | Lee |
| 2007/0018043 A1 | 1/2007 | Lamoree et al. |
| 2007/0019102 A1 | 1/2007 | Nakajo et al. |
| 2007/0025715 A1 | 2/2007 | Lin |
| 2007/0032169 A1 | 2/2007 | Neely et al. |
| 2007/0037485 A1 | 2/2007 | Neely |
| 2007/0052050 A1 | 3/2007 | Dierickx |
| 2007/0053672 A1 | 3/2007 | Westerweck et al. |
| 2007/0074966 A1 | 4/2007 | Yamamoto et al. |
| 2007/0077052 A1 | 4/2007 | Chang |
| 2007/0086777 A1 | 4/2007 | Fujita |
| 2007/0091198 A1* | 4/2007 | Watanabe et al. ......... 348/340 |
| 2007/0108847 A1 | 5/2007 | Chang |
| 2007/0122146 A1 | 5/2007 | Ryu |
| 2007/0126898 A1 | 6/2007 | Feldman et al. |
| 2007/0146489 A1 | 6/2007 | Kosako et al. |
| 2007/0147195 A1 | 6/2007 | Morinaga |
| 2007/0154198 A1 | 7/2007 | Oh et al. |
| 2007/0166029 A1 | 7/2007 | Lee et al. |
| 2007/0201866 A1 | 8/2007 | Kihara |
| 2007/0217786 A1 | 9/2007 | Cho et al. |
| 2007/0236591 A1 | 10/2007 | Tam et al. |
| 2007/0258006 A1 | 11/2007 | Olsen et al. |
| 2007/0275505 A1* | 11/2007 | Wolterink et al. ......... 438/118 |
| 2007/0278394 A1 | 12/2007 | Shangguan et al. |
| 2007/0280667 A1 | 12/2007 | Shin |
| 2008/0040069 A1 | 2/2008 | Grziwa et al. |
| 2008/0058010 A1 | 3/2008 | Lee |
| 2008/0068728 A1 | 3/2008 | Westerweck et al. |
| 2008/0074528 A1 | 3/2008 | Westerweck et al. |
| 2008/0136956 A1 | 6/2008 | Morris et al. |
| 2008/0143864 A1* | 6/2008 | Yamaguchi et al. ......... 348/340 |
| 2008/0158362 A1 | 7/2008 | Butterworth |
| 2008/0170141 A1 | 7/2008 | Tam et al. |
| 2008/0180566 A1 | 7/2008 | Singh |
| 2008/0225415 A1 | 9/2008 | Bogue et al. |
| 2008/0252770 A1 | 10/2008 | Raschke |
| 2008/0252795 A1 | 10/2008 | Bone et al. |
| 2008/0278617 A1 | 11/2008 | Tanida et al. |
| 2008/0279544 A1 | 11/2008 | Westerweck |
| 2008/0279545 A1 | 11/2008 | Westerweck |
| 2009/0015706 A1 | 1/2009 | Singh |
| 2009/0027869 A1 | 1/2009 | Uchida et al. |
| 2009/0046376 A1 | 2/2009 | Westerweck et al. |
| 2009/0103193 A1 | 4/2009 | Berube |
| 2009/0115891 A1 | 5/2009 | Ryu et al. |
| 2009/0128681 A1 | 5/2009 | Kim |
| 2009/0213262 A1 | 8/2009 | Singh et al. |
| 2009/0243051 A1 | 10/2009 | Vanam et al. |
| 2009/0267170 A1 | 10/2009 | Chien et al. |
| 2010/0141825 A1 | 6/2010 | Kim et al. |
| 2010/0325883 A1 | 12/2010 | Westerweck et al. |
| 2011/0037886 A1 | 2/2011 | Singh et al. |
| 2011/0052183 A1 | 3/2011 | Westerweck |
| 2011/0096213 A1 | 4/2011 | Hasegawa |
| 2011/0292526 A1 | 12/2011 | Westerweck et al. |
| 2012/0106939 A1 | 5/2012 | Toor et al. |
| 2012/0218449 A1 | 8/2012 | Pavithran et al. |
| 2012/0230664 A1 | 9/2012 | Pavithran et al. |

FOREIGN PATENT DOCUMENTS

| | | |
|---|---|---|
| CN | 1517736 A | 8/2004 |
| CN | 1666130 A | 9/2005 |
| CN | 1682377 A | 10/2005 |
| CN | 1719590 A | 1/2006 |
| CN | 1846166 A | 10/2006 |

(56) References Cited

FOREIGN PATENT DOCUMENTS

| | | |
|---|---|---|
| DE | 200 17 490 U1 | 12/2000 |
| DE | 10346374 A1 | 4/2005 |
| EP | 1148406 A2 | 10/2001 |
| EP | 1148406 A3 | 6/2002 |
| EP | 1288694 A1 | 3/2003 |
| EP | 1357726 A1 | 10/2003 |
| EP | 1 387 397 A2 | 2/2004 |
| EP | 1441509 A2 | 7/2004 |
| EP | 1443754 A2 | 8/2004 |
| GB | 1378515 A1 | 12/1974 |
| GB | 2315186 A | 1/1998 |
| GB | 2387063 A | 10/2003 |
| JP | 59-176710 | 6/1984 |
| JP | 02-019106 U | 2/1990 |
| JP | 02-123335 A | 5/1990 |
| JP | 06-160699 A | 6/1994 |
| JP | 07-005550 A | 1/1995 |
| JP | H07 1995-181389 A | 7/1995 |
| JP | 09-113787 A | 5/1997 |
| JP | 11-052210 A | 2/1999 |
| JP | 11-072678 A | 3/1999 |
| JP | 2001-292365 A | 10/2001 |
| JP | 2001-333332 A | 11/2001 |
| JP | 2002-010123 A | 1/2002 |
| JP | 2002-098878 A | 4/2002 |
| JP | 2002-169076 A | 6/2002 |
| JP | 2002-286987 A | 10/2002 |
| JP | 2003-337279 A | 11/2003 |
| JP | 2004-080774 A | 3/2004 |
| JP | 2004-282778 A | 7/2004 |
| JP | 2004-325764 A | 11/2004 |
| JP | 2005-107084 A | 4/2005 |
| JP | 2005-148109 A | 6/2005 |
| JP | 2005-157290 A | 6/2005 |
| JP | 2005-189414 A | 7/2005 |
| JP | 2005-266129 A | 9/2005 |
| JP | 2005-340539 A | 12/2005 |
| JP | 2005-539276 A | 12/2005 |
| JP | 2006-039480 A | 2/2006 |
| JP | 2006-053232 A | 2/2006 |
| JP | 2006-054506 A | 2/2006 |
| JP | 2006-154319 A | 6/2006 |
| JP | 2006-248878 A | 9/2006 |
| JP | 2006-276897 A | 10/2006 |
| JP | 2007-017974 A | 1/2007 |
| JP | 2007-108534 A | 4/2007 |
| JP | 2007-174380 A | 7/2007 |
| JP | 2007-274624 A | 10/2007 |
| JP | 4027962 B1 | 12/2007 |
| JP | 2008-294960 A | 12/2008 |
| KR | 2005/0000722 A | 1/2005 |
| KR | 10 2007 0073017 A | 7/2007 |
| TW | I221 207 | 9/2004 |
| TW | 236573 B | 7/2005 |
| WO | WO 00/06973 A1 | 2/2000 |
| WO | WO 2004/027880 | 4/2004 |
| WO | WO 2006/011200 A1 | 2/2006 |
| WO | WO 2006/025698 | 3/2006 |
| WO | WO 2006/035963 | 4/2006 |
| WO | WO 2006/093377 | 9/2006 |
| WO | WO 2007/016413 A2 | 2/2007 |
| WO | WO 2007/016414 A2 | 2/2007 |
| WO | WO 2008/021167 A2 | 2/2008 |
| WO | WO 2008/070125 A2 | 6/2008 |
| WO | WO 2008/079403 A2 | 7/2008 |
| WO | WO 2008/085489 A1 | 7/2008 |
| WO | WO 2012/161802 A2 | 11/2012 |

OTHER PUBLICATIONS

PCT Application No. PCT/US2008/005289, International Search Report and Written Opinion dated Sep. 2, 2008.
PCT Application No. PCT/US2008/005289, International Preliminary Report on Patentability dated Nov. 5, 2009.
CN Patent Application Serial No. 200880021337.3, Office Action dated Feb. 28, 2011.
U.S. Appl. No. 12/150,119, Office Action dated Dec. 16, 2010.
PCT Application No. PCT/US2008/005298, International Search Report and Written Opinion dated Sep. 2, 2008.
PCT Application No. PCT/US2008/005298, International Preliminary Report on Patentability dated Nov. 5, 2009.
CN Patent Application Serial No. 200880021357.0, Office Action dated Mar. 9, 2011.
*High Precision Optical Assembly Starts Here*, Opto-Alignment Technology, Inc., Jan. 1996.
U.S. Appl. No. 11/242,646, Office Action dated Jan. 30, 3008.
U.S. Appl. No. 11/242,646, Notice of Allowance dated Aug. 21, 3008.
U.S. Appl. No. 11/242,646, Supplemental Notice of Allowance dated Sep. 24, 3008.
PCT Application No. PCT/US2006/035660, International Search Report and Written Opinion dated May 22, 2007.
PCT Application No. PCT/US2006/035660, International Preliminary Report on Patentability dated Apr. 17, 2008.
EP Application No. 06803508.8, Extended European Search Report dated Jun. 25, 2010.
EP Application No. 06803508.8, Office Action dated Jul. 13, 2010.
EP Application No. 06 803 508.8 Notice of Allowance dated Nov. 16, 2012.
JP Application No. 2008-533403, Office Action dated Jul. 25, 2011 (English translation).
JP Application No. 2008-533403, Office Action dated Apr. 2, 2012 (English translation).
JP Application No. 2008-533403, Office Action dated Jan. 7, 2013 (English translation).
TW Application No. 095134310, Office Action dated Nov. 4, 2008 (English translation).
TW Application No. 095134310, Office Action dated Jun. 23, 2009 (English translation).
TW Application No. 095134310, Notice of Allowance dated Dec. 16, 2009 (English translation).
U.S. Appl. No. 12/317,295, Office Action dated Jul. 17, 2009.
U.S. Appl. No. 12/317,295, Office Action dated Feb. 22, 2010.
U.S. Appl. No. 12/317,295, Notice of Allowance dated Sep. 9, 2010.
U.S. Appl. No. 12/317,295, Petition Granted Notice dated Oct 25, 2010.
U.S. Appl. No. 12/930,799, Office Action dated Sep. 7, 2011.
U.S. Appl. No. 12/930,799, Office Action dated Nov. 28, 2011.
U.S. Appl. No. 12/930,799, Notice of Allowance dated Jan. 20, 2012.
U.S. Appl. No. 13/232,722, Office Action dated Feb. 17, 2012.
U.S. Appl. No. 13/232,722, Office Action dated May 29, 2012.
U.S. Appl. No. 13/232,722, Office Action dated Sep. 7, 2012.
U.S. Appl. No. 11/228,010, Office Action dated Aug. 2, 2007.
U.S. Appl. No. 11/228,010, Office Action dated Apr. 23, 2008.
U.S. Appl. No. 11/228,010, Interview Summary dated Oct. 14, 2008.
U.S. Appl. No. 11/228,010, Office Action dated Jan. 7, 2009.
U.S. Appl. No. 11/228,010, Notice of Allowance dated Nov. 3, 2009.
U.S. Appl. No. 11/228,010, Supplemental Notice of Allowance dated Feb. 5, 2010.
PCT Application No. PCT/US2006/035852, International Search Report and Written Opinion dated Sep. 13, 2007.
PCT Application No. PCT/US2006/035852, International Preliminary Report on Patentability dated Mar. 27, 2008.
CN Application No. 200680040738.4, Office Action dated Oct. 30, 2009 (English translation).
CN Application No. 200680040738.4, Office Action dated Aug. 4, 2010 (English translation).
CN Application No. 200680040738.4, Office Action dated Dec. 16, 2011 (English translation).
CN Application No. 200680040738.4, Office Action dated Apr. 24, 2012 (English translation).
EP Application No. 06 803 604.5, Restriction Requirement dated May 26, 2010.
EP Application No. 06 803 604.5, European Search Report dated Sep. 6, 2010.
EP Application No. 06 803 604.5, Office Action dated Sep. 23, 2010.

(56) References Cited

OTHER PUBLICATIONS

EP Application No. 06 803 604.5, Notice of Allowance dated Feb. 6, 2013.
TW Application No. 095130828, Office Action dated Nov. 26, 2009 (English translation).
TW Application No. 095130828, Office Action dated Oct. 28, 2010 (English translation).
TW Application No. 095130828, Notice of Allowance dated Feb. 16, 2012 (English translation).
U.S. Appl. No. 11/982,726, Restriction Requirement dated Jan. 11, 2010.
U.S. Appl. No. 11/982,726, Office Action dated Apr. 20, 2010.
U.S. Appl. No. 11/982,726, Notice of Allowance dated Nov. 15, 2010.
U.S. Appl. No. 11/982,726, Notice of Allowance dated Mar. 8, 2011.
PCT Application No. PCT/US2007/023335, ISR and WO dated Mar. 12, 2008.
PCT Application No. PCT/US2007/023335, IPRP dated May 14, 2009.
CN Application No. 200780040705.4, Office Action dated Jun. 11, 2010 (English translation).
CN Application No. 200780040705.4, Notice of Allowance dated Jan. 7, 2011 (English translation).
CN Application No. 201110063877.1, Office Action dated Mar. 28, 2012 (English translation).
CN Application No. 201110063877.1, Office Action dated Dec. 5, 2012 (English translation).
JP Application No. 2009-535535, Office Action dated Nov. 7, 2011 (English translation).
JP Application No. 2009-535535, Office Action dated May 21, 2012 (English translation).
U.S. Appl. No. 11/982,846, Office Action dated Dec. 15, 2009.
U.S. Appl. No. 11/982,846, Notice of Allowance dated Apr. 7, 2010.
PCT Application No. PCT/US2007/023388, International Search Report and Written Opinion dated Mar. 12, 2008.
PCT Application No. PCT/US2007/023388, International Preliminary Report on Patentability dated May 14, 2009.
CN Application No. 200780041066.3, Office Action dated Jan. 26, 2011 (English translation).
JP Application No. 2009-535360, Office Action dated Jun. 13, 2012 (English translation).
JP Application No. 2009-535360, Notice of Allowance dated Oct. 3, 2012 (English translation).
U.S. Appl. No. 12/590,325, Office Action dated Dec. 7, 2011.
U.S. Appl. No. 12/590,325, Notice of Allowance dated May 23, 2012.
PCT Application No. PCT/US2010/002913, International Search Report and Written Opinion dated Jan. 5, 2011.
PCT Application No. PCT/US2010/002913, International Preliminary Report on Patentability dated Jan. 13, 2012.
PCT Application No. PCT/US2012/026585, International Search Report dated Dec. 26, 2012.
U.S. Appl. No. 11/980,021, Notice of Allowance, dated Sep. 2, 2010.
PCT Application No. PCT/US08/008708, International Search Report & Written Opinion dated Dec. 10, 2008.
PCT Application No. PCT/US08/008708, International Preliminary Report on Patentability dated Jan. 19, 2010.
CN Application No. 2008/0023704.3, Office Action dated Jan. 26, 2011 (English translation).
CN Application No. 2008/0023704.3, Office Action dated Jun. 30, 2011 (English translation).
CN Application No. 2008/0023704.3, Office Action dated Dec. 7, 2011 (English translation).
CN Application No. 2008/0023704.3, Office Action dated Jul. 24, 2012 (English translation).
JP Application No. 2010-517011, Office Action dated Dec. 6, 2011 (English translation).
JP Application No. 2010-517011, Office Action dated Oct. 30, 2012 (English translation).
U.S. Appl. No. 12/873,995, Office Action dated Mar. 27, 2012.
U.S. Appl. No. 12/873,995, Office Action dated Jul. 18, 2012.
U.S. Appl. No. 12/873,995, Advisory Action dated Sep. 7, 2012.
U.S. Appl. No. 13/046,563, Office Action dated Sep. 12, 2012.
U.S. Appl. No. 13/232,722, Office Action dated Mar. 22, 2013.
U.S. Appl. No. 12/583,193, Office Action dated Jan. 18, 2012.
U.S. Appl. No. 12/583,193, Office Action dated Oct. 12, 2012.
PCT Application No. PCT/US2010/002251, International Search Report and Written Opinion dated Oct. 4, 2010.
PCT Application No. PCT/US2010/002251, International Preliminary Report on Patentability dated Feb. 23, 2012.
KR Application No. 10-2012-7006585, Office Action dated Mar. 4, 2011 (English translation).
U.S. Appl. No. 12/368,454 Office Action dated Mar. 31, 2011.
U.S. Appl. No. 12/368,454 Office Action dated Sep. 14, 2011.
U.S. Appl. No. 12/368,454 Advisory Action dated Nov. 23, 2011.
U.S. Appl. No. 12/368,454 Office Action dated Jan. 20, 2012.
U.S. Appl. No. 12/368,454 Office Action dated Nov. 2, 2012.
PCT Application No. PCT/US09/034528 International Search Report dated Apr. 20, 2009.
PCT Application No. PCT/US09/034528 International Preliminary Report on Patentability dated Feb. 24, 2010.
CN Patent Application Serial No. 200980111373.3, Office Action dated May 17, 20122011 (English translation).
CN Patent Application Serial No. 200980111373.3, Office Action dated Feb. 17, 20132011 (English translation).
U.S. Appl. No. 60/859,519, coversheet, specification, claims, and drawings filed Nov. 17, 2006.
U.S. Appl. No. 13/404,838, Office Action dated Mar. 27, 2013.
JP Patent Application Serial No. 2010-506257, Office Action dated Oct. 17 2011 (English summary of Office Action included).
JP Patent Application Serial No. 2010-506257, Office Action dated Sep. 6, 2012 (English summary of Office Action included).
U.S. Appl. No. 12/150,119, Office Action dated Sep. 28, 2011.
U.S. Appl. No. 12/150,119, Office Action dated Apr. 30, 2012.
CN Patent Application Serial No. 200880021357.0, Office Action dated Mar. 30, 2012.
CN Patent Application Serial No. 200880021357.0, Office Action dated Dec. 21, 2012.
JP Patent Application Serial No. 2010-506259, Office Action dated Oct. 17 2011 (English summary of Office Action included).
JP Patent Application Serial No. 2010-506259, Office Action dated Jun. 11, 2012.
EP Application No. 06803508.8, Supplemental Notice of Allowance dated May 21, 2013.
EP Application No. 13 163 397.6, European Search Report dated Jun. 3, 2013.
JP Application No. 0212-039255, Office Action dated Jun. 5, 2013 (English translation).
JP Application No. 2012-524704, Office Action dated Apr. 4, 2013 (English translation).
U.S. Appl. No. 12/150,119, Office Action dated Apr. 16, 2013.
U.S. Appl. No. 13/404,838, Interview Summary dated Apr. 26, 2013.
U.S. Appl. No. 12/368,454 Office Action dated Apr. 26, 2013.
U.S. Appl. No. 12/873,995, Office Action dated May 31, 2013.
U.S. Appl. No. 13/046,563, Notice of Allowance dated May 14, 2013.
CN Patent Application Serial No. 200880021357.0, Office Action dated Jul. 3, 2013 (English translation).
JP Patent Application Serial No. 2010-547748, Office Action dated Jun. 25, 2013 (English translation).
JP Patent Application Serial No. 2012-537862, Office Action dated Aug. 6, 2013 (English translation).
U.S. Appl. No. 12/583,193, Office Action dated Jun. 27, 2013.
U.S. Appl. No. 13/149,638, Restriction Requirement dated Jun. 19, 2013.

* cited by examiner

SMALL FORM FACTOR MODULES USING WAFER LEVEL OPTICS WITH BOTTOM CAVITY AND FLIP-CHIP ASSEMBLY

RELATED APPLICATIONS

This application claims the benefit of U.S. Provisional Patent Application No. 60/925,946, filed Apr. 24, 2007 by the same inventor, which is incorporated herein by reference in its entirety.

BACKGROUND OF THE INVENTION

1. Field of the Invention

This invention relates generally to electronic devices, and more particularly to digital camera modules. Even more particularly, this invention relates to a design for a simplified wafer level camera module that can be reflow soldered to a hosting device.

2. Description of the Background Art

Digital camera modules are currently being incorporated into a variety of host devices. Such host devices include cellular telephones, personal data assistants (PDAs), computers, etc. Therefore, consumer demand for digital camera modules in host devices continues to grow.

Host device manufacturers prefer digital camera modules to be small, so that they can be incorporated into the host device without increasing the overall size of the host device. Further, host device manufacturers prefer camera modules that minimally affect host device design. In meeting these requirements the host device manufacturers prefer camera modules that capture images of the highest possible quality. Of course, it is an ongoing goal for camera module manufacturers to design camera modules that meet these requirements at minimal manufacturing cost.

A conventional digital camera module generally includes a lens assembly, a housing, a printed circuit board (PCB), and an integrated image capture device (ICD). Typically, the components are formed separately and later assembled to create the digital camera module. That is, the ICD is attached to the PCB, and then the housing is attached to the PCB so that the ICD is covered by the bottom of the housing. Then, the lens assembly is mounted to the opposite end of the housing to focus incident light onto an image capture surface of the ICD. Typically, the lens assembly includes a sloped surface (e.g., threads, cam, ramps, etc.) that engage a complementary sloped surface formed on the housing such that proper focusing can be achieved by rotating the lens assembly within the housing. After the lens assembly is properly displaced with respect to the image capture surface, the lens assembly is fixed (e.g., via adhesive, thermal weld, etc.) with respect to the housing. The ICD is electrically coupled to the PCB, which includes a plurality of electrical contacts for the ICD to communicate image data to the host device for processing, display, and storage.

In manufacturing these camera modules, many problems are encountered by the camera module manufacturers. As an example, bare ICD dies are extremely vulnerable to contamination when exposed to contaminants such as dust and/or other particulate debris. Further, ICDs are extremely vulnerable when exposed to materials (e.g., adhesives) and processes (e.g., housing attachment, molding, lens attachment, etc.) used in the assembly of the camera modules. Contamination typically results in the discarding of the defective image capture devices which can be extremely expensive, especially when yield losses are high. To minimize contamination, the camera modules are typically assembled in class 100 clean rooms. Although the image capture devices of assembled camera modules are protected from contaminants outside of the camera module, they are still vulnerable to internal contaminants. Such internal contaminants are usually the result of trapped dust, adhesives, and/or particulates formed by frictional wear within the camera module. Frictional wear typically occurs during assembly processes such as focusing. In particular, particles are formed when the sloped surface of the lens assembly rubs against the sloped surface of the housing. Contamination of an image sensor after the camera is assembled can be especially expensive because the entire camera module may have to be discarded.

Another challenge faced by camera module manufacturers is that the components of camera modules are extremely small and, therefore, require extremely delicate, and therefore, expensive processes for fabrication, assembly, and alignment. Indeed, the alignment process becomes increasingly more difficult as the number of required camera module components is increased. This is because the strict position tolerances between camera module components accumulate proportionally with the number of components coupling the image capture surface to the lenses. Ideally, the lenses should all be coaxially perpendicular to the center of the planar image capture surface. However, this is typically only achieved within a predetermined overall tolerance defined by the sum of: the tolerance of the ICD with respect to the PCB, the tolerance of the PCB with respect to the housing, the tolerance of the housing with respect to the focus/zoom device, and the tolerances of the lenses with respect to the focus/zoom device.

As yet another example problem, camera modules typically cannot be reflow soldered to host devices without damaging the camera module. Reflow soldering is a very well developed and efficient electronic manufacturing process. Therefore, it would be desirable to be able to use a reflow solder process to attach camera modules to host devices. However, known devices cannot withstand reflow solder attachment.

What is needed, therefore, is a camera module that is less vulnerable to contamination of the image capture surface. What is also needed is a camera module that can be assembled with a more forgiving tolerance between the lenses and the image capture surface. What is also needed is a camera module that requires fewer components and fewer manufacturing steps. What is also needed is a camera module that can withstand a reflow soldering process.

SUMMARY

The present invention overcomes the problems associated with the prior art by providing a camera module and a method manufacturing the camera module that protects the image capture surface against contamination, has relaxed assembly tolerances, and requires relatively few components and manufacturing steps. The invention also facilitates attachment of the camera module in a host system via a reflow solder process.

A disclosed method of manufacturing a camera module includes providing a stack of optical elements, providing an integrated circuit image capture device (ICD) having a top surface with an array of sensors, rigidly attaching the stack of optical elements to top surface of the image capture device, providing a substrate having an opening therethrough and a recess around said opening, and attaching the image capture device to the substrate such that edges of the image capture device are disposed in the recess and the stack of optical elements extends through the opening. The method further includes providing a second substrate (e.g., host PCB) and mounting the substrate on the second substrate to attach the camera module to the host device. Optionally, the substrate is mounted to the second substrate via a reflow solder process.

In a particular method, the step of attaching the image capture device to the substrate includes electrically connecting a set of electrical contacts on the image capture device to a complementary set of electrical contacts on the substrate. In an example method, the step of electrically connecting the set of electrical contacts to the complementary set of electrical contacts is accomplished via a flip-chip die attach process. In addition, the substrate includes a second set of electrical contacts to facilitate connecting the substrate to the circuit board of a host device.

In the disclosed example method, the stack of optical elements is separated from a plurality of similar stacks of optical elements prior to being attached to the top surface of the image capture device. The stack of optical elements is tested prior to being attached to the top surface of the image capture device. The stack of optical elements includes a cavity and a bottom surface defining an opening into the cavity. The step of rigidly attaching the stack of optical elements to the top surface of the image capture device includes adhering the bottom surface of the stack of optical elements to an area of the top surface of the image capture device surrounding the array of sensors, so the cavity forms a sealed air gap over the array of sensors.

No focus operation is required during the assembly process. Therefore, no focus mechanism is provided in the camera module.

A novel camera module is also disclosed. The camera module includes a mounting substrate defining an opening therethrough and a recess around the opening and an integrated circuit ICD including a sensor array formed in a top surface of the ICD. The ICD is mounted in the recess of the mounting substrate. The recess is deeper than the ICD is thick, such that the bottom surface of the ICD does not extend past the bottom surface of the mounting substrate. The camera module further includes a stack of optical elements fixed to the top surface of the image capture device and extending through the opening in the mounting substrate. The camera module is free of any focus mechanism.

In the disclosed example embodiment, the mounting substrate includes a set of electrical contacts formed on a surface of the recess, and the image capture device includes a set of complementary electrical contacts formed on the top surface of the image capture device. The image capture device is mounted in the recess of the mounting substrate by forming electrical connections between associated pairs of the electrical contacts and the complementary electrical contacts.

The mounting substrate further includes a second set of electrical contacts for electrically connecting the mounting substrate to a circuit board of a host device. The second set of electrical contacts are electrically coupled to the set of electrical contacts to connect the circuitry of the image capture device with circuitry of the circuit board of the host device.

In the disclosed example camera module, the stack of optical elements, the image capture device, and the mounting substrate can all withstand a solder reflow process.

The stack of optical elements includes a cavity and a bottom surface. The bottom surface defines an opening into the cavity. The stack of optical elements is fixed to the top surface of the image capture device by attaching the bottom surface of the stack of optical elements to the top surface of said image capture device. The opening into the cavity surrounds the sensor array, and the cavity provides an air gap over the sensor array. In a particular embodiment, the stack of optical elements includes a plurality of individual lens elements that are bonded directly to one another.

A camera module according to the present invention can also be described as including an integrated circuit ICD including a sensor array formed in a top surface of the ICD, a stack of optical elements fixed to the top surface of said image capture device, and means for attaching the integrated image capture device to a circuit board of a host device via a reflow solder process.

BRIEF DESCRIPTION OF THE DRAWINGS

The present invention is described with reference to the following drawings, wherein like reference numbers denote substantially similar elements.

DETAILED DESCRIPTION

The present invention overcomes the problems associated with the prior art, by providing a simplified wafer level camera module that can withstand reflow soldering conditions. In the following description, numerous specific details are set forth (e.g., number of lenses, type of epoxy, electrical contact types, etc.) in order to provide a thorough understanding of the invention. Those skilled in the art will recognize, however, that the invention may be practiced apart from these specific details. In other instances, details of well known electronic assembly practices and equipment have been omitted, so as not to unnecessarily obscure the present invention.

Figure 1:
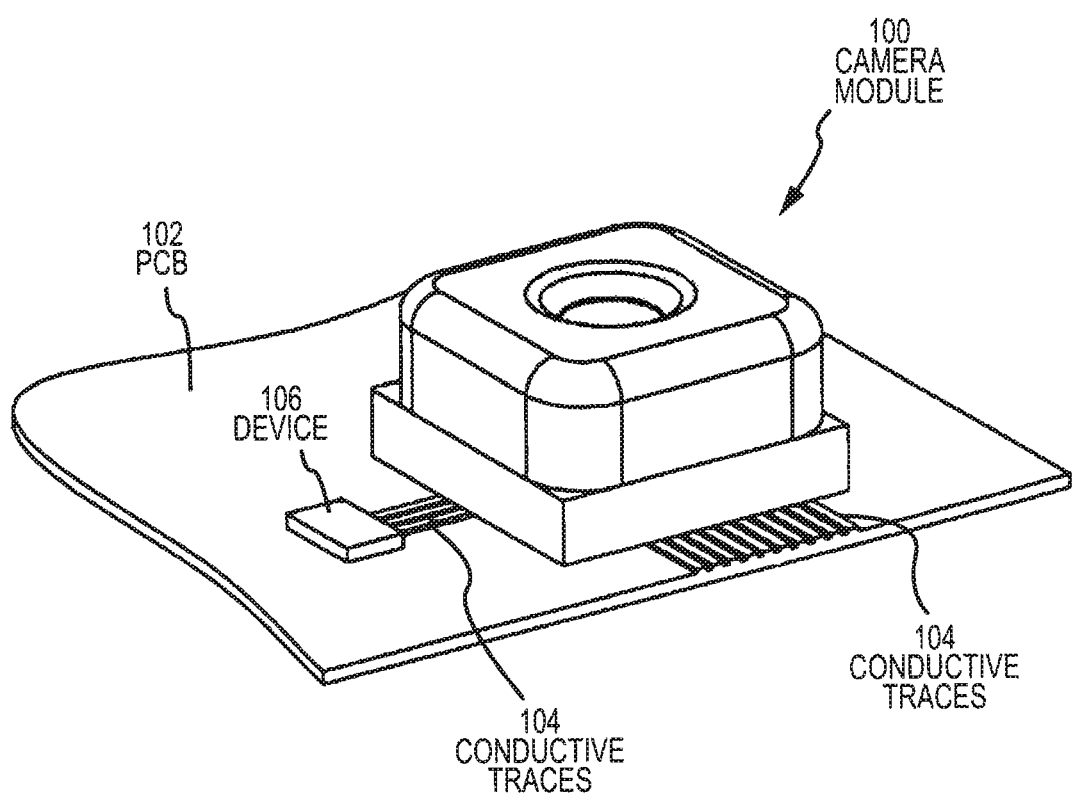
FIG. 1 is a perspective view of a camera module mounted on a printed circuit board of a host device.

FIG. 1 is a perspective view of a camera module 100 according to one embodiment of the present invention. Camera module 100 is shown mounted on a portion of a printed circuit board (PCB) 102 that represents a main PCB of a camera hosting device (e.g., cell phone, PDA, etc.). Camera module 100 communicates electrically with other components of the hosting device via a plurality of conductive traces 104. Device 106 represents an electronic component (e.g., passive component) that may be mounted directly on PCB 102. Those skilled in the art will recognize that the particular design of PCB 102 will depend on the particular application, and is not particularly relevant to the present invention. Therefore, PCB 102, traces 104, and device 106 are representational in character only.

Figure 2:
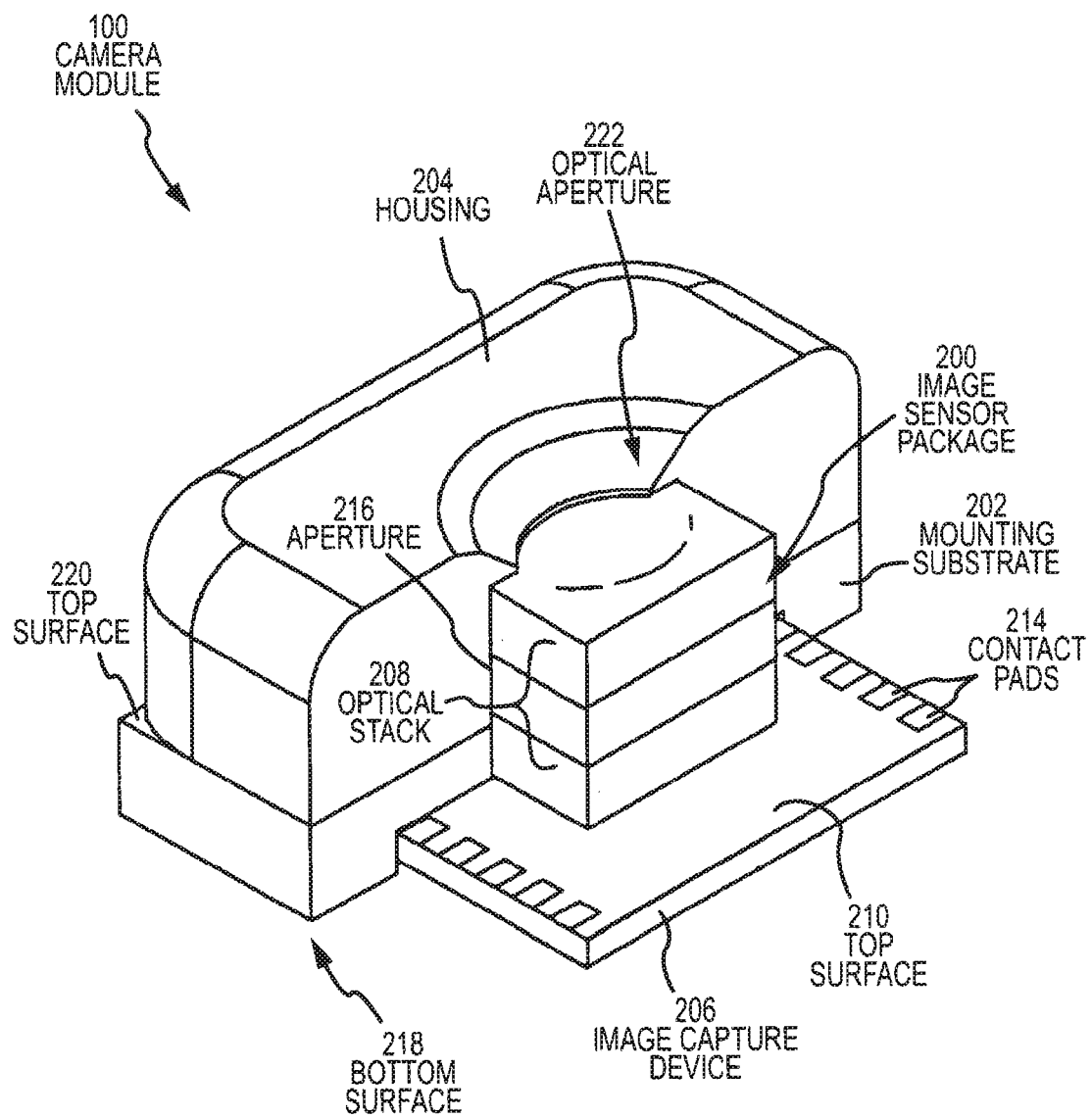
FIG. 2 is a partially sectioned, perspective view of the camera module of FIG. 1.

FIG. 2 is a partially-sectioned perspective view of camera module 100 including an image sensor package 200, a mounting substrate 202, and a housing 204. Image sensor package 200 includes an integrated circuit image capture device (ICD) 206 and an optical stack 208. ICD 206 includes a top surface 210, whereon optical stack 208 is rigidly attached over an image capture surface 212 (shown in FIG. 3). Image capture surface 212 includes an array of optical sensors (not individually shown). Top surface 210 further includes a set of contact pads 214, which in this particular example are gold stud bumped to facilitate the flip-chip bonding of ICD 206 to mounting substrate 202. This aspect of the invention will be described in greater detail with reference to subsequent figures.

Mounting substrate 202 includes an aperture 216 (more clearly shown in subsequent figures), a bottom surface 218, and a top surface 220. Aperture 216 provides an opening to receive optical stack 208 when image sensor package 200 is flip-chip mounted to mounting substrate 202. Bottom surface 218 facilitates the mounting of camera module 100 to PCB 102 and includes a set of electrical contacts (FIG. 4) to provide electrical connections between ICD 206 and PCB 102. Top surface 220 provides a support surface upon which housing 204 can be formed or attached.

In this particular embodiment, housing 204 is molded directly over top surface 220 and around optical stack 208, leaving an optical aperture 222. The overmolding process of housing 204 is done after image sensor package 200 is flip-chip bonded to mounting substrate 202. Alternatively, housing 204 can be pre-formed (e.g., molding) and then attached to mounting substrate 202 by some suitable means (e.g., adhesive, thermal weld, etc.).

Figure 3:
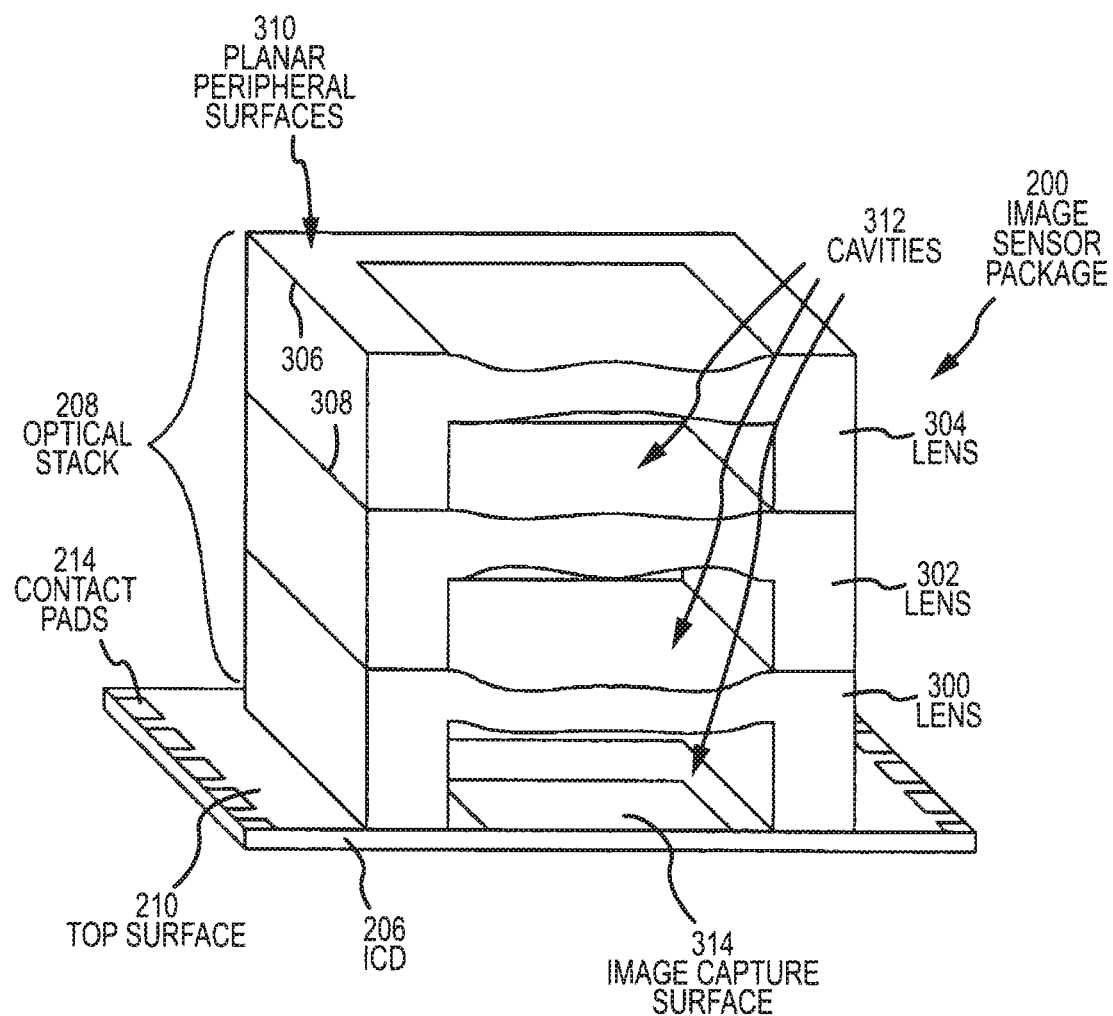
FIG. 3 is a sectional view of a stack of optical elements on an image capture device of the camera module of FIG. 1.

FIG. 3 shows a cross-sectioned view of image sensor package 200. Optical stack 208 includes three lenses 300, 302, and 304 fixed to one another in a stacked relationship and fixed directly onto top surface 210 of ICD 206. In particular, lens 300 is fixed to top surface 210, lens 302 is fixed to lens 300, and lens 304 is fixed to lens 302. Each of lenses 300, 302, and 304 include both a top surface 306 and a bottom surface 308. Top surfaces 306 and bottom surfaces 308 both include planar peripheral surfaces 310 which are all parallel to one another to facilitate stacking. Optionally, top surfaces 306 and bottom surfaces 308 can include complementary registration features, which properly position lenses 300, 302, and 304 with respect to one another when engaged. Each of bottom surfaces 308 defines an opening into a cavity 312, which is particularly important for lens 300, because it prevents contact between an image capture surface 314 and lens 300. Further, the perimeter of the opening into cavity 312 is greater than the outer perimeter of image capture surface 314, thus preventing contact between image capture surface 314 and bottom surface 308 of lens 300. Cavities 312 also provide air gaps between the lenses 300, 302, and 304 and between lens 300 and image capture surface 314, which can be an important feature of the optical prescription of optical stack 208. In this particular embodiment of the invention, cavity 312 of lens 300 is approximately 40-50 microns deep.

When bottom surface 308 of lens element 300 is bonded to top surface 210 of ICD 206, image capture surface 314 is completely sealed. As a result, image capture surface 314 is protected from particulate contamination. In this example embodiment, optical stack 208 is attached to top surface 210 of ICD 206 with an optical grade adhesive, for example an adhesive commercially available under the trade name Optocast 3553 HM. An acceptable bond line thickness is 5±2 microns.

No focus mechanism is required and, therefore, none is provided. The reason for this is that the wafer level assembly of optical stack 208 and the direct attachment of optical stack 208 to ICD 206 are very precise. In addition, the tolerance stack up (accumulation) suffered by prior art devices is effectively eliminated.

Figure 4:
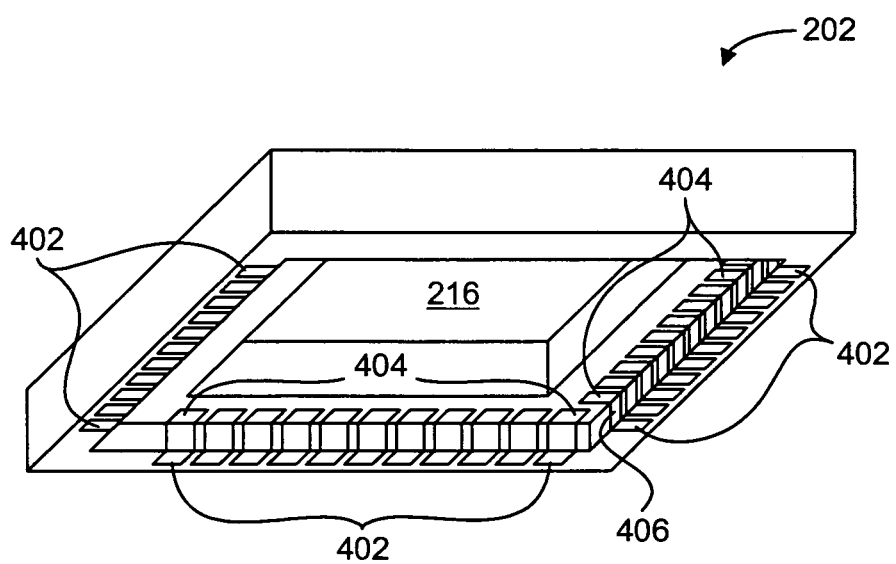
FIG. 4 is a bottom perspective view of a mounting substrate of the camera module of FIG. 1.

FIG. 4 is a bottom perspective view of mounting substrate 202. As shown, mounting substrate 202 includes a first set of electrical contacts 402 and a second set of electrical contacts 404, associated pairs of which are connected via electrical connectors 406. First set of electrical contacts 402 provide a means for electrically connecting mounting substrate 202 to PCB 102 (FIG. 1) via a reflow solder process. Second set of electrical contacts 404 is formed on a surface of a recess surrounding opening 216 and provides a means for electrically connecting ICD 206 to mounting substrate 202. Electrical connectors 406 complete the electrical connection between the circuitry of ICD 206 and the circuitry of PCB 102.

Figure 5:
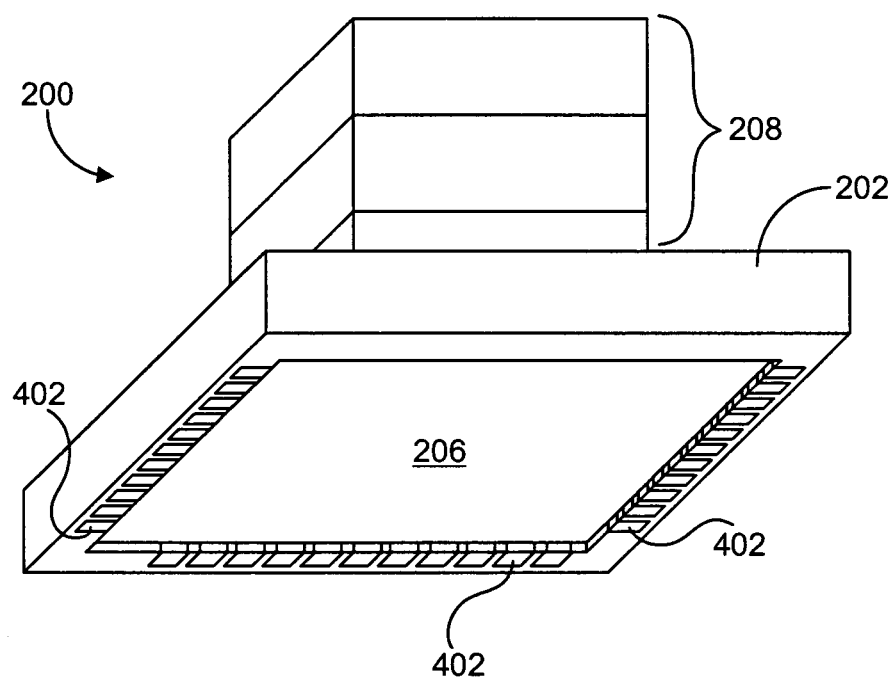
FIG. 5 is a bottom perspective view of the optical stack and image capture device of FIG. 3 mounted in the mounting substrate of FIG. 4.

FIG. 5 is a bottom perspective view showing image sensor package 200 flip-chip mounted to mounting substrate 202. ICD 206 is disposed completely within the recess formed in the bottom of mounting substrate 202, such that ICD will not interfere with the mounting of substrate 202 onto PCB 102 (FIG. 1). Optical stack 208 extends upwardly through opening 216 (not visible in FIG. 5). Contacts 402 remain visible on the bottom surface of mounting substrate 202.

Figure 6:
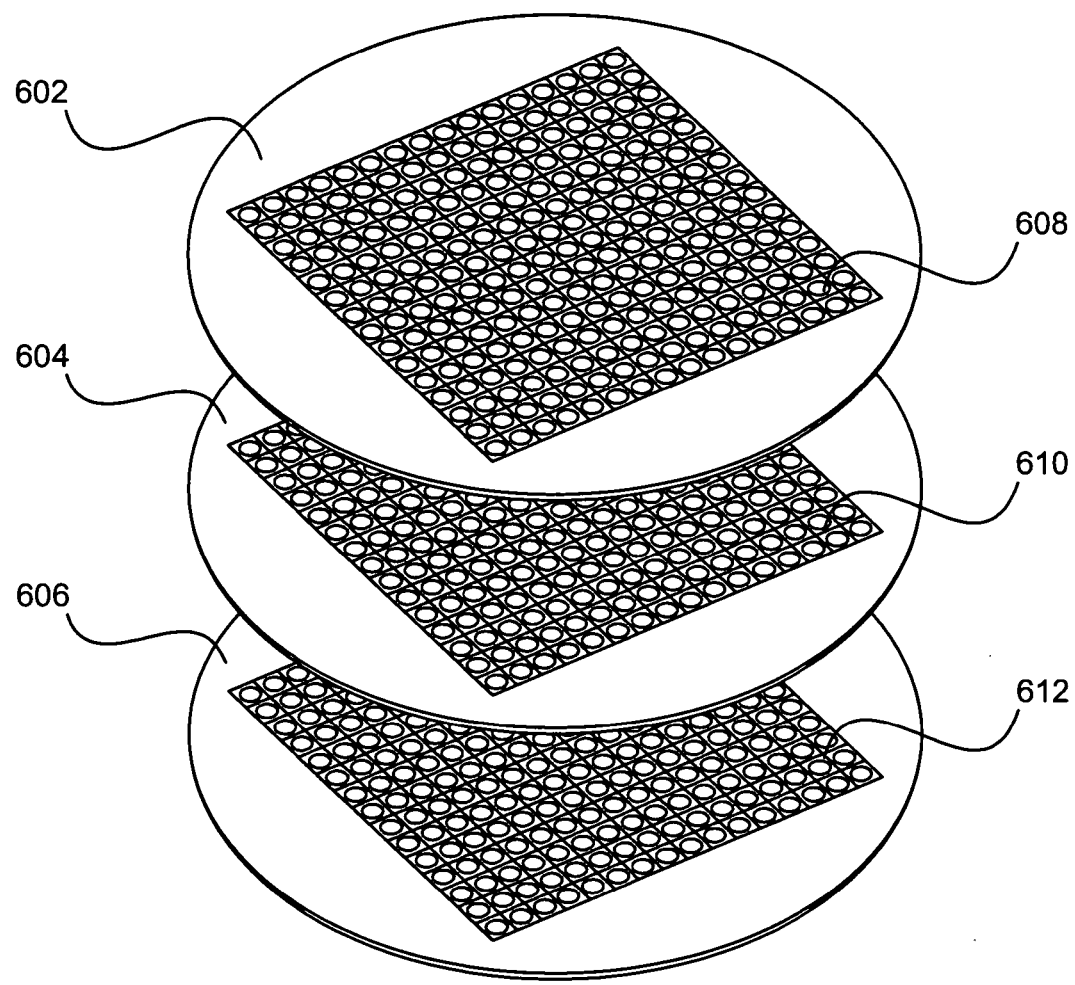
FIG. 6 is a perspective view of a plurality of lens wafers used to manufacture the stack of optical elements of FIGS. 2, 3, and 5.

FIG. 6 is an exploded perspective view of three glass wafers 602, 604, and 606 used in forming optical stack 208. Glass wafers 602, 604, and, 606 include lens arrays 608, 610, and 612, respectively, which are individually formed by some suitable means such as etching/replication technology. After the lens arrays are formed, the glass wafers are vertically aligned such that each individual lens is coaxially aligned with two other individual lenses. The glass wafers are then adhered to one another in a stacked relationship in preparation for a separation process which will yield several individual optical stacks 208.

Alternatively, glass wafers 602, 604, and 606 can be bonded to a wafer including a like plurality of integrated circuit image capture devices (ICDs), before separation of the wafers into individual ICDs with attached lens stacks. However, it can be more difficult to separate the lens wafers and the ICD wafer at the same time, because separation may require the dicing of the glass wafers over the active areas of the silicon ICD wafer. In addition, bonding the lenses to the wafers prior to separation reduces the yield of lenses from the glass wafers, because the lens stacks occupy a smaller area than the ICDs. Therefore, if the glass wafers are diced prior to attachment to the ICD wafer, the lenses can be positioned closer together rather than having a spacing that must match the spacing of the ICDs.

Figure 7:
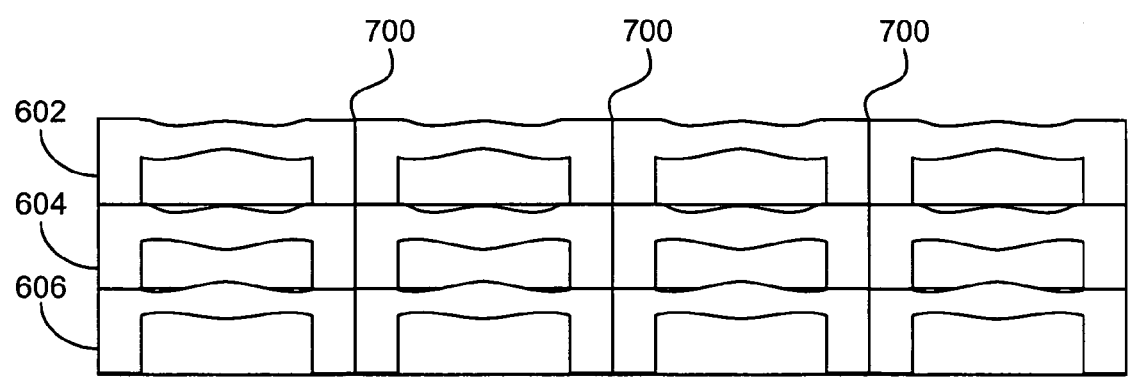
FIG. 7 is a cross-sectional view of a portion of the lens wafers of FIG. 6.

FIG. 7 is a cross-sectioned view of a small portion of glass wafers 602, 604, and 606 aligned and adhered to one another. After the glass wafers are adhered to one another, the lenses are tested for quality and then diced along lines 700 to form multiple individual optical stacks 208. After individual optical stacks 208 are formed, they are cleaned and prepared to be mounted on ICDs.

Figure 8:
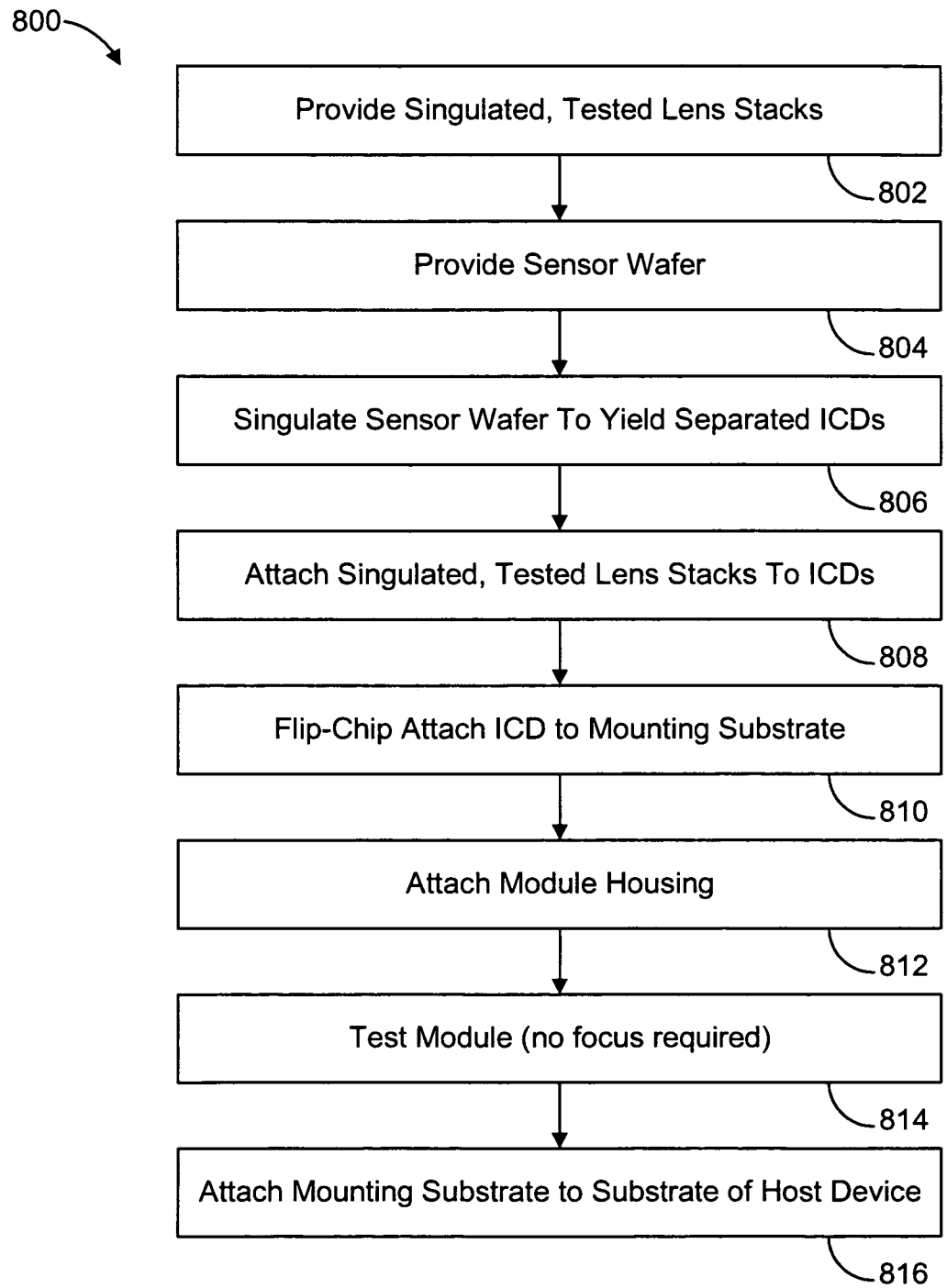
FIG. 8 is a flow chart summarizing one method of manufacturing the camera module of FIG. 1.

FIG. 8 is a flow chart summarizing one method 800 of manufacturing a camera module according to the present invention. In a first step 802, singulated, tested lens stacks are provided. For example, and without limitation, two or more glass wafers (2"-12") are processed to form miniature optics elements on the individual glass wafers using etching or replication technologies. As explained above, the bottom glass wafer has a predefined cavity (larger than the image capture surface of the ICD). The glass wafers are then stacked and adhered on top of each other to form wafer level optical stacks. The optical stacks are then tested for quality and diced to yield singulated, tested lens stacks.

Next, in a second step 804, a sensor wafer (wafer of ICDs) is provided. For example, and without limitation, a sensor wafer (e.g., 8"-12") undergoes gold stud bumping to facilitate flip-chip attachment to a substrate. After the gold stud bumping, the sensor wafer undergoes back-grinding to achieve a thickness of about 120-250 microns.

Next, in a third step 806, the sensor wafer is singulated to yield separate ICDs. For example, and without limitation, the sensor wafer is diced, and a carrier wafer is attached to the bottom of the sensor wafer to provide rigidity. The sensor wafer then undergoes wafer wash and/or plasma cleaning to ensure the sensor area of each individual ICD is contamination free.

Next, in a fourth step 808, the singulated, tested lens stacks are attached to the ICDs. During attachment, the lens stacks are optically centered on the ICDs and bonded with an optical grade epoxy or glue. The adhesive is then cured (e.g., V, thermal, etc.) to complete the bonding process.

Next, in a fifth step 810, the ICD with the attached lens stack is flip chip mounted to the mounting substrate. Then, in a sixth step 812, a housing is attached to form a camera module. Next, in a seventh step 814, each camera module is tested. Finally, in an eighth step 816, the camera module is attached to a substrate (e.g., a PCB) of a host device. Optionally, this attachment is accomplished via a reflow solder process.

The description of particular embodiments of the present invention is now complete. Many of the described features may be substituted, altered or omitted without departing from the scope of the invention. For example, different numbers of lens elements may be used to form the optical stacks mounted on the ICDs. As another example, an IR filter can be integrated in the optical glass used to form the optical stacks, thereby reducing the number of components and assembly steps needed to complete the module. These and other deviations from the particular embodiments shown will be apparent to those skilled in the art, particularly in view of the foregoing disclosure.

I claim:

1. A method of manufacturing a camera module, said method comprising:
   providing a stack of optical elements;
   providing an integrated circuit image capture device, said image capture device having a top surface with an array of sensors;
   rigidly attaching said stack of optical elements to said top surface of said image capture device;
   providing a substrate having an opening therethrough and a recess around said opening; and
   attaching said image capture device with said stack of optical elements attached thereto to said substrate such that edges of said image capture device are disposed in said recess and said stack of optical elements extends through said opening;
   wherein the stack of optical elements includes a plurality of lens elements that are each individually and integrally formed so that each lens element can be adhered directly to an adjacent lens element and further wherein each lens element includes at least one cavity formed in a surface thereof to create a predefined distance from an optical surface of the lens element to an optical surface of the adjacent lens element or image capture device.

2. The method of claim 1, further comprising:
   providing a second substrate;
   mounting said substrate on said second substrate.

3. The method of claim 2, wherein:
   said second substrate is a printed circuit board of a host device; and
   said substrate is mounted to said second substrate via a reflow solder process.

4. The method of claim 1, wherein said stack of optical elements is separated from a plurality of similar stacks of optical elements prior to being attached to said top surface of said image capture device.

5. The method of claim 1, wherein said stack of optical elements is tested prior to being attached to said top surface of said image capture device.

6. The method of claim 1, wherein said stack of optical elements includes:
   a cavity; and
   a bottom surface defining an opening into said cavity.

7. The method of claim 6, wherein said step of rigidly attaching said stack of optical elements to said top surface of said image capture device includes adhering said bottom surface of said stack of optical elements to an area of said top surface of said image capture device surrounding said array of sensors, said cavity forming an air gap over said array of sensors.

8. The method of claim 1, wherein no focus mechanism is provided in said camera module.

9. The method of claim 1, wherein said step of attaching said image capture device to said substrate includes electrically connecting a set of electrical contacts on said image capture device to a complementary set of electrical contacts on said substrate.

10. The method of claim 9, wherein said step of electrically connecting said set of electrical contacts to said complementary set of electrical contacts is accomplished via a flip-chip die attach process.

11. The method of claim 9, wherein said substrate includes a second set of electrical contacts to facilitate connecting said substrate to a circuit board of a host device.

12. The method of claim 1, wherein said substrate is formed prior to said step of attaching said image capture device to said substrate.

13. A camera module comprising:
   a mounting substrate defining an opening therethrough and a recess around said opening;
   an integrated circuit image capture device including a sensor array formed in a top surface of said image capture device, said image capture device being mounted in said recess of said mounting substrate; and
   a stack of optical elements fixed to said top surface of said image capture device and extending through said opening in said mounting substrate;
   wherein the stack of optical elements includes a plurality of lens elements, including a first lens element, a second lens element, and a third lens element, that are each individually and integrally formed so that each lens element can be adhered directly to an adjacent lens element and further wherein each lens element includes at least one cavity formed in a surface thereof to create a predefined distance from an optical surface of the lens element to an optical surface of the adjacent lens element or image capture device.

14. The camera module of claim 13, wherein:
   said mounting substrate includes a set of electrical contacts formed on a surface of said recess;
   said image capture device includes a set of complementary electrical contacts formed on said top surface of said image capture device; and
   said image capture device is mounted in said recess of said mounting substrate by forming electrical connections between associated pairs of said electrical contacts and said complementary electrical contacts.

15. The camera module of claim 13, wherein
said mounting substrate further includes a second set of electrical contacts for electrically connecting said mounting substrate to a circuit board of a host device; and
said second set of electrical contacts are electrically coupled to said set of electrical contacts to connect the circuitry of said image capture device with circuitry of said circuit board of said host device.

16. The camera module of claim 13, wherein said stack of optical elements, said image capture device, and said mounting substrate can all withstand a solder reflow process.

17. The camera module of claim 13, wherein said camera module is free of any focus mechanism.

18. The camera module of claim 13, wherein said mounting substrate is a pre-formed component.

19. A camera module, comprising:
an image capture device having a top surface with a peripheral edge, with a plurality of electrical contact pads located on the peripheral edge of the top surface;
a lens including a stack of lens elements, including a first lens element, a second lens element, and a third lens element, the lens being affixed to the top surface of the image capture device; and
a mounting substrate having a top surface and a bottom surface, the bottom surface having a recess defined therein, the recess having the same shape as the peripheral edge of the top surface of the image capture device and the recess being sized to closely receive the image capture device therein, the mounting substrate also including an aperture therethrough that is shaped and sized to closely receive the stack of lens elements therethrough when the image capture device is received within the recess.

20. A camera module as defined in claim 19, wherein the mounting substrate includes a planar top surface, the camera module further including a housing affixed to the planar top surface of the mounting substrate, the housing having an aperture defined in a top surface thereof, the housing partially enclosing the stack of lens elements therein and allowing light to pass through the aperture to impinge upon the stack of lens elements.

21. A camera module as defined in claim 19, wherein the recess includes a first set of electrical contacts on a first wall thereof to correspond with and electrically contact the electrical contacts of the image capture device and the recess also includes a set of electrical connectors on a second wall thereof that is orthogonal to the first wall thereof, each of the set of connectors being electrically connected to a corresponding one of the first set of electrical contacts, and wherein the bottom surface of the mounting substrate that is peripherally outside of the recess includes a second set of electrical contacts and each of the second set of electrical contacts is electrically connected to a corresponding one of the set of electrical connectors.

* * * * *